(12) United States Patent
Navoni et al.

(10) Patent No.: US 6,512,851 B2
(45) Date of Patent: Jan. 28, 2003

(54) WORD RECOGNITION DEVICE AND METHOD

(75) Inventors: Loris Navoni, Cernusco Sul Naviglio (IT); Roberto Canegallo, Tortona (IT); Mauro Chinosi, Cologno Monzese (IT); Giovanni Gozzini, Palazzolo Sull 'Oglio (IT); Alan Kramer, Berkeley, CA (US); Pierluigi Rolandi, Volpedo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/974,290

(22) Filed: Oct. 9, 2001

(65) Prior Publication Data

US 2002/0034329 A1 Mar. 21, 2002

Related U.S. Application Data

(63) Continuation of application No. 09/022,666, filed on Feb. 12, 1998.

(30) Foreign Application Priority Data

Feb. 12, 1997 (EP) ............................................. 97830052

(51) Int. Cl.$^7$ ............................. G06K 9/72; G06F 12/00
(52) U.S. Cl. ...................................... 382/229; 711/108
(58) Field of Search ................................ 382/229, 230, 382/231, 304; 707/6; 706/15; 345/193, 196, 517, 516; 365/49, 50; 711/108, 128

(56) References Cited

U.S. PATENT DOCUMENTS

| 3,651,459 | A | * | 3/1972 | Hahn ........................... 382/231 |
| 3,969,698 | A | * | 7/1976 | Bollinger et al. ............ 382/225 |
| 4,490,811 | A | | 12/1984 | Yianilos et al. .............. 364/900 |
| 4,581,756 | A | * | 4/1986 | Togawa et al. .............. 704/254 |
| 4,783,830 | A | | 11/1988 | Johnson et al. ................ 382/34 |
| 4,799,271 | A | * | 1/1989 | Nagasawa et al. ........... 382/231 |
| 4,805,093 | A | * | 2/1989 | Ward .......................... 711/108 |

(List continued on next page.)

FOREIGN PATENT DOCUMENTS

| DE | 3801380 A1 | 7/1988 |
| WO | WO 88/02887 | 4/1988 |

OTHER PUBLICATIONS

Chen et al., "Off–Line Handwritten Word Recognition Using a Hidden Markov Model Type Stochasitc Network," *IEEE Transactions on Pattern Analysis and Machine Intelligence*, 15(5):481–496, May 1994.

(List continued on next page.)

*Primary Examiner*—Joseph Mancuso
*Assistant Examiner*—Martin Miller
(74) *Attorney, Agent, or Firm*—Lisa K. Jorgenson; David V. Carlson; Seed IP Law Group PLLC

(57) ABSTRACT

A word recognition device uses an associative memory to store a plurality of coded words in such a way that a weight is associated with each character of the alphabet of the stored words, wherein equal weights correspond to equal characters. To perform the recognition, a dictionary of words is first chosen; this is stored in the associative memory according to a pre-determined code; a string of characters which correspond to a word to be recognized is received; a sequence of weights corresponding to the string of characters received is supplied to the associative memory; the distance between the word to be recognized and at least some of the stored words is calculated in parallel as the sum of the difference between the weights of each character of the word to be recognized and the weights of each character of the stored words; the minimum distance is identified; and the word stored in the associative memory having the minimum distance is stored.

15 Claims, 4 Drawing Sheets

| Column | 0...3 | 4...8 | 9...14 | 15...21 | 22...29 | 30...39 | 39...63 |
|---|---|---|---|---|---|---|---|
| Maximum Number of Characters | 4 | 5 | 6 | 7 | 8 | 9 | 24 |
| Number of Words | 3177 | 3169 | 3877 | 4072 | 3622 | 3093 | 4080 |

U.S. PATENT DOCUMENTS

| | | | | |
|---|---|---|---|---|
| 5,058,184 A | * | 10/1991 | Fukushima | 382/158 |
| 5,161,203 A | * | 11/1992 | Buckley | 382/157 |
| 5,276,741 A | * | 1/1994 | Aragon | 382/229 |
| 5,299,269 A | * | 3/1994 | Gaborski et al. | 382/156 |
| 5,303,381 A | * | 4/1994 | Yagasaki | 340/146.2 |
| 5,371,697 A | * | 12/1994 | Yamada | 365/185.22 |
| 5,377,349 A | * | 12/1994 | Motomura | 707/7 |
| 5,390,260 A | * | 2/1995 | Bezek | 382/187 |
| 5,418,886 A | * | 5/1995 | Oita et al. | 706/25 |
| 5,687,286 A | * | 11/1997 | Bar-Yam | 704/202 |
| 5,850,480 A | * | 12/1998 | Scanlon | 382/187 |
| 5,862,128 A | * | 1/1999 | Cooperman et al. | 370/229 |

OTHER PUBLICATIONS

U. Ramacher et al., "VLSI Design of an Associative Memory Based on Distributed Storage of Information," *VLSI Design of Neural Networks*, Kluwer Academic Publisher, pp. 153–168, 1991.

Kramer et al., "55GCPS CAM Using 5–bit Analog Flash," in *Proceedings in the Innovative System Design Group–Central R & D*, Agrate Brianza, Italy, Feb. 1997.

Doise, D. et al. 55GPS CAM analog flash, Solid–State Circuits conference, Feb. 8, 1997.

Kramer et al., "Ultra–Low–Power Analog Associative Memory Core Using Flash–EEPROM–Based Programmable Capacitors," *in Proceedings of the Dana Point Resort*, SCM–SIGDA and IEEE–CAS, Dana Point, California, pp. 203–208, Apr. 23–26, 1995.

Navoni et al., "Words Recognition using Associative Memory," *in Proceedings of the Fourth, The International Conference on Document Analysis and Recognition*, IEEE Computer Society, Los Alamitos, California, :1–5, Aug. 18–20, 1997.

Kramer et al., "Flash–Based Programmable Nonlinear Capacitor for Switched Implementations of Neural Networks," *IEDM Tech. Dig.*, pp. 17.6.1–17.6.4, Dec. 1994.

* cited by examiner

| $0...max(1)-1$ | $max(1)...max(1)+max(2)-1$ | ... | $\sum_{i=1}^{j-1} max(i)...N$ |
|---|---|---|---|
| elem.0 ci.1 | elem.0 ci.2 | ... | elem.0 ci.j |
| elem.1 ci.1 | elem.1 ci.2 | ... | elem.1 ci.j |
| elem.2 ci.1 | elem.2 ci.2 | ... | elem.2 ci.j |
| ... | ... | ... | ... |

| Column | 0...3 | 4...8 | 9...14 | 15...21 | 22...29 | 30...39 | 39...63 |
|---|---|---|---|---|---|---|---|
| Maximum Number of Characters | 4 | 5 | 6 | 7 | 8 | 9 | 24 |
| Number of Words | 3177 | 3169 | 3877 | 4072 | 3622 | 3093 | 4080 |

Fig. 6

| D | O | Q | B | - | G | C | L | Z | I | T | J | S | - | E | F | P | - | Y | U | V | N | W | M | H | A | R | K | X |

WORD RECOGNITION DEVICE AND METHOD

TECHNICAL FIELD

The invention relates to a word recognition device and method.

BACKGROUND OF THE INVENTION

As is known, for reading text, particularly hand-written text, various character recognition systems have been developed, based on text segmentation, to separate the individual characters or portions thereof one from another, and on processing of the segments obtained for the identification of the characters. This procedure outputs a series of characters including spaces and punctuation marks.

Current systems are not, however, always capable of outputting correct data because of the presence of noise, the particular graphical characteristics of the text or the limited capacities of the recognition system. Consequently, further processing of the characters is necessary so as to guarantee the correctness of the sequence of characters and the extraction of meaningful words.

For these reasons, word recognition devices have been proposed which compare the input word to be recognized with a plurality of words belonging to a vocabulary, until a word in the vocabulary which is identical to the word to be recognized is identified or the word in the vocabulary that is nearest to that to be recognized is identified. The comparison procedure, when carried out sequentially on the words in the vocabulary, requires a considerable amount of time.

SUMMARY OF THE INVENTION

An object of the invention is to produce a word recognition device and method capable of processing the input characters so as to output the word or words having the sequence of characters closest to the input word in a simple and speedy manner.

In a first embodiment, the invention includes a method having steps of selecting a dictionary of words and associating an analog weight with each character of an alphabet forming the words. The analog weights are such that equal analog weights correspond to identical characters. The method also includes steps of storing the analog weights in a first analog associative memory and dividing the words into groups. Each group corresponds to words having common lengths. The method additionally includes a step of transforming each word of each group of words via the analog weights stored in the first analog associative memory into a sequence of analog weights, to provide groups of analog weight sequences. Each group of analog weight sequences corresponds to one of the groups of words having common lengths. The method further includes steps of separating a second analog associative memory into portions and storing the groups of analog weight sequences in the second analog associative memory such that each group of words corresponds to only one of the portions in the second analog associative memory.

In a second preferred embodiment, the present invention includes a method having steps of receiving a character string corresponding to a word, determining a length of the character string and transforming the character string into a series of analog signals via analog weights stored in a first analog associative memory. Equal analog weights correspond to identical characters. The method also includes a step of coupling the series of analog signals to a portion of a second analog associative memory having a dictionary stored therein. Each word of the dictionary corresponds to an analog weight sequence stored in the second analog associative memory. The portion of the second analog associative memory stores words having lengths comparable to the length of the character string. The method additionally includes steps of computing distances between each analog weight sequence stored in the portion and the series of analog signals, selecting those distances that are less than a predetermined distance and writing data corresponding to those analog weight sequences providing distances less than the predetermined distance to a memory.

BRIEF DESCRIPTION OF THE DRAWINGS

For an understanding of the invention, a preferred embodiment will now be described, purely by way of non-exhaustive example, with reference to the accompanying drawings in which:

FIG. 6 shows a table relating to the character recognition errors;

DETAILED DESCRIPTION OF THE INVENTION

Figure 1:
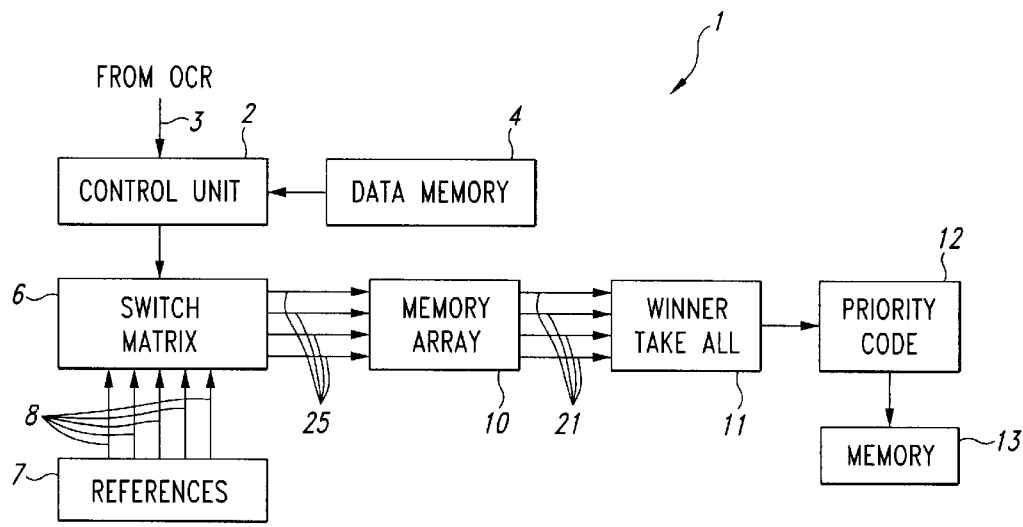
FIG. 1 is a general block diagram of a word recognition device produced according to the invention.

In FIG. 1, the word recognition device 1 is located downstream of an OCR or optical character recognition system (not shown) which is provided according to any known technique, as described, for example, in the article entitled "Off-line Handwritten Word Recognition Using a Hidden Markow Model Type Stochastic Network" by Mou-Yen Chen, Amlan Kundu and Jian Zhou, IEEE Transactions on Pattern Analysis and Machine Intelligence, Vol. 16, No. 5, May 1994.

The device 1 comprises a control unit 2, which coordinates the activities of the device 1, as described in this specification below, and has an input 3 at which it receives, from the OCR system, strings of characters on the basis of which the words are to be recognized; a data memory 4, storing data necessary for the control unit 2 and coupled thereto; a switch matrix 6, coupled to the control unit 2; a reference voltage generator 7, coupled to the switch matrix 6 by means of input lines 8; a memory array 10, coupled to the switch matrix 6 by means of input lines 25; a selection block 11, coupled to the outputs of the memory array 10 to identify the output of the memory array 10 which has minimum value; a priority code generation block 12, coupled to the output of the selection block; and a memory element 13, coupled to the output of the priority code generation block 12.

In detail, the control unit 2, which may be a microprocessor or other software processing unit, for example, determines the length of successive words, supplied by the character recognition system, on the basis of the length of the strings of characters not separated by spaces or punctuation marks and, on the basis of the architecture of the memory and of the coding used for the characters, it provides commands to the switch matrix 6. For this purpose the data memory 4 supplies the control unit 2 with data relating to the organization of the memory array 10 (i.e., data relating to the columns 25 of the array 10 in which words of a given length are stored, as explained below) and data relating to the coding used for the individual characters, i.e., to the weight (voltage level) associated with each character of the alphabet as well as which of the lines 8 supplies that weight. Consequently, the switch matrix 6 couples the lines 8 associated with the weights corresponding to the word to be recognized to the pre-determined lines 25 of the memory array 10. The voltage values corresponding to the weights of the different letters, according to a pre-determined coding, are generated by the reference voltage generator 7 which may, for example, be provided as described in European patent application 96830498.0 filed on Sep. 30, 1996 in the name of this applicant. The switch matrix 6 may be of any acceptable type of the many known in the prior art, such as that described in European patent application 96830497.2 filed on Sep. 30, 1996 in the name of this applicant.

The hardware to implement the memory array 10 comprises a memory of the associative type, or content addressable memory of a type well known in the art. When this type of memory receives a datum formed by a sequence of elements at its input, it outputs a datum correlated to the address of the line (generally row) in which the datum closest to the input datum is stored. Preferably, the memory 10 is of the auto-associative type, or it directly outputs the stored datum closest to the input datum. For example, the hardware to perform the memory function for the memory array 10 may be of any acceptable type of the many known in the prior art, such as that described in the article by A. Kramer, M. Sabatini, R. Canegallo, M. Chinosi, P. L. Rolandi and P. Zabberoni entitled "Flash-Based Programmable Nonlinear Capacitor for Switched-Capacitor Implementations of Neural Networks" in IEDM Tech. Dig., pp. 17.6.1–17.6.4, December 1994.

Figure 2:
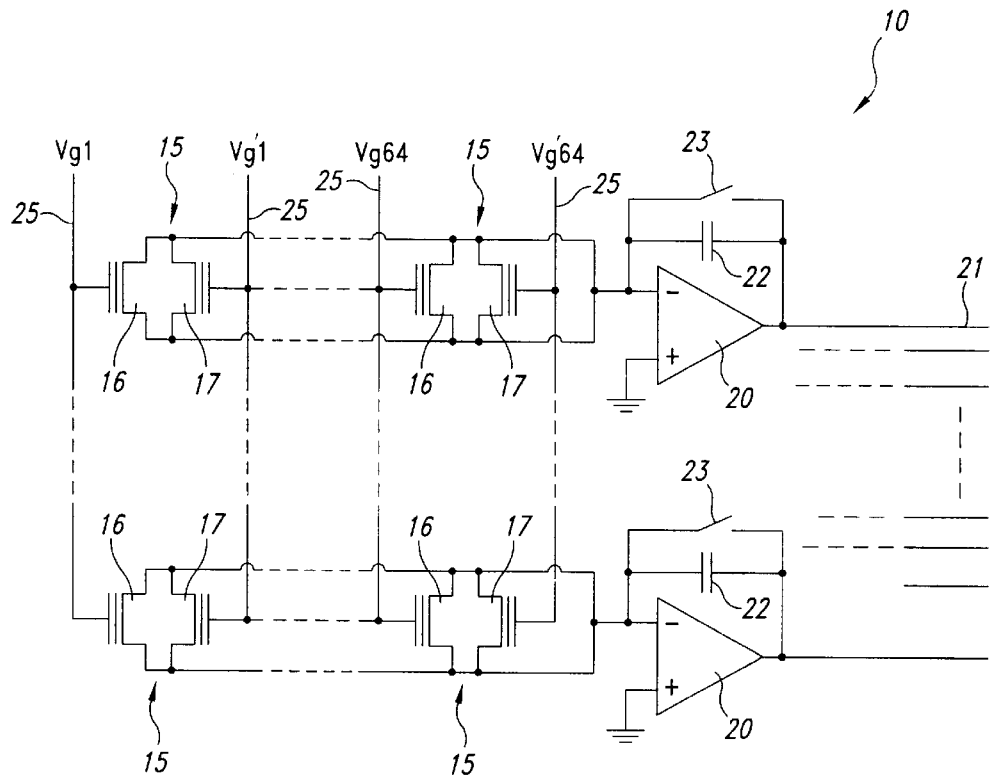
FIG. 2 shows the architecture of the memory array.

In detail, as shown for clarity in FIG. 2, is one example of the hardware for the memory array 10 which comprises M×N pairs of cells 15 (4000×64 pairs of cells for example), located in M rows and N columns. Each pair of cells 15 comprises a first cell 16 and a second cell 17. The drain and source terminals of all the cells 16, 17 disposed on the same row are coupled together to the inverting input of an operational amplifier 20 in a charge integration configuration, having a non-inverting input coupled to earth and an output 21 coupled to the inverting input via a capacitor 22. A reset switch 23 controlled by the control unit 2 (in a manner not shown) is located in parallel to the capacitor 22. The outputs 21 of the operational amplifiers 20 define the outputs of the memory array 10.

The gate terminals of the first cells 16 belonging to the same column are coupled to the same input line 25 of the memory whilst the gate terminals of the second cells 17 belonging to the same column are coupled to a respective different input 25. With this hardware configuration, as described in detail in the above-mentioned article by Kramer et al., by storing a pre-determined voltage value in each pair of cells and by supplying complementary voltage values Vg and V'g at the inputs 25 of the two cells 16, 17 of a pair 15, a voltage value is obtained at each output 21 of the array 10. This voltage is proportional to the Manhattan distance between the input vector and the vector stored in each row.

The distance values present at the outputs 21 of the memory array 10 are supplied to the selection block 11 for identification of the rows having shorter distance; the selection block 11 is of known type and described, for example, in "Winner-take-all-networks of O(n) complexity" by Lazzaro, S Ryckenbusch, M A Mahowald and C Mead in Tourestzky D (ed), Advances in Neural Network Information Processing Systems 1. San Mateo Calif.: Morgan Kauffmann Publisher, pp. 703–711 (1988). The addresses of the rows at minimum distance (or the stored contents of the rows) are then supplied to the priority code generation block 12 which places them in a priority code, starting from the row (or vector) at minimum distance and then to the memory element 13 (an EEPROM, ROM, RAM, or other memory for example) for them to be stored.

The word recognition device 1 of FIG. 1 operates according to the following method, described with reference to the flowchart of FIG. 3.

Initially a dictionary I is selected, or a base of meaningful words in a certain language, block 30; this dictionary must be suited to the physical limitations of the memory array 10. A coding of the dictionary is then defined such as to show the characteristics of the language in a readily computable way, block 31. As indicated, the coding takes place by associating an appropriate voltage value (weight) to each character of the alphabet, as exemplified below. Then, block 32, the dictionary is inserted into the memory array 10 using the coding defined above, preferably storing several words in each row of the array, as described below.

Subsequently, block 33, the sequence of characters belonging to a word to be recognized is input into the memory array 10, using the same coding of the characters used to store the dictionary. Specifically, on the basis of the coding table stored in the data memory 4, the control unit 2 commands the switch matrix 6 so that the matrix 6 supplies to the input lines 25 of the memory array 10 the corresponding pairs of voltage values which are complementary to each other and generated by the reference voltage generator 7.

The memory array 10 then calculates the distance between the word to be recognized and each of the words stored in the memory array 10 or in the desired portion thereof, namely it calculates the sum of the distance between the weights associated with the characters forming the word to be recognized and the weights associated with the corresponding characters of the words stored in the individual rows (or addressed portions of rows), block 34. In particular, if we call the coding of a single element (character) of a stored word $a_i$ and the coding of a corresponding element (character) of the word to be recognized $b_i$, the memory array 10 calculates the distance dist defined as:

$$dist = \sum_{j=1}^{L} \theta(a_i, b_i)$$

in which L is the length of the word to be recognized and θ represents the generic calculation function of the distance (the Manhattan distance in the case of the memory array illustrated above).

On the basis of this distance, as described above, the blocks 11–13 are capable of showing and storing addresses of the rows of the array 10 relating to the words closest to the input word or directly storing the words, block 35.

In this way, the search for stored words most similar to an input word is carried out in parallel on the entire array or on a pre-determined portion thereof. The output words may then be subjected to further processing for a better reconstruction of the original text on the basis of other criteria such as the context, more or less common use of the words identified (frequency), etc.

To optimize the occupation of the memory array 10 in view of the presence of words of variable length, it is also proposed to organize the memory array 10 by dividing it into sub-groups (groups of columns or of rows) which are selectively addressable by the control unit 2 through the switch matrix 6, and then to carry out a dedicated search considering only the words linked to the input configuration, or having homologous dimensions.

In detail, given the memory array 10 of dimension M×N, given the base I (dictionary) of storable configurations (words) of different length, also coming from different types of data, by dividing the base I into a number s of classes, each containing configurations having the same maximum length; indicating by max(j) the maximum length of the configurations contained in the class j, plus an arbitrary number of additional elements (such as the frequency of the configuration-word-expressed as a codified number), whenever the following inequality is met:

$$\max(1)+\max(2)+\ldots+\max(j-1)+\max(j) \leq N$$

for $j \leq s$. This configuration excludes at most a limited number of elements of the base I. It is possible to organize the memory array 10 in such a way that each line of the memory array 10 comprises a plurality (j) of groups of memory locations, with each group of locations of a line being intended for the storage of a word. Adjacent groups of memory locations on the same line store words of different maximum length, whilst groups of memory locations belonging to different lines but disposed on the same columns store words belonging to the same class (having the same length).

Figures 3, 4, 5:
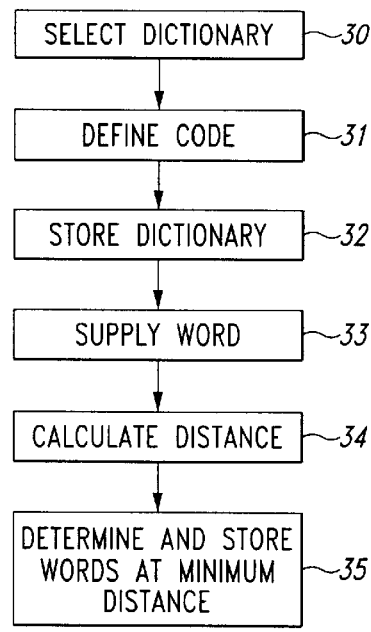
FIG. 3 is a flow-chart relating to the recognition method according to the invention.
FIGS. 4 and 5 show tables relating to the organization of the memory array of FIG. 2.

An example of organization of the memory array 10 in the case in which the words are stored in rows is shown in the table in FIG. 4. In this table, the columns of the array 10 are re-grouped into groups of columns each associated with a different class of the base I (and the number of columns of each group is equal to the maximum length of the configurations belonging to the respective class). The configurations (words) belonging to the same class are stored in different rows of the respective group of columns.

Given this organization, by considering a dictionary I of approx. 25,000 words of different length, taking into account that the frequency of the words in a text decreases as the length of the words increases and that words of length greater than 24 characters represent 0.4% of the total, it is possible to sub-divide the memory array 10 as illustrated in detail in the table shown in FIG. 5. The organization described above enables 90% occupation of the memory to be obtained with only 0.4% of the words in the dictionary that are not stored.

With this type of organization, word recognition takes place by comparing the word supplied to the inputs 25 of the memory array 10 with the words stored in the corresponding group of columns, as stored in the data memory 4.

The organization described above enables different types of data to be loaded onto the same line, associating them with the classes organized by columns and then selecting the calculation on the basis of the data required. For example, as an alternative to that shown in the table of FIG. 5, in which the memory array 10 stores only complete words, it is possible to store in the same memory array (but in another portion thereof) the weights used for the recognition of the individual characters and in another portion the weights used for the recognition of the words, thereby using a single memory device both for the recognition of characters (OCR) and for the recognition of words.

By using a five bit coding of the memory cells 16, 17, it is possible to program up to 32 different levels. Noting that the Latin alphabet comprises 26 letters, the coding of the words may take place by associating a different voltage level of pre-determined value with each character of the alphabet forming a word. The six remaining levels may be used for the coding of characters which are special or used as word separators.

Advantageously, the assignment of the weight (voltage level) to each character is carried out taking account of the "morphological closeness" of the different characters. In particular, this is carried out on the basis of the following considerations.

Every character recognition device is capable of supplying at least three types of responses: a correct response, when the device succeeds in recognizing the character correctly; an incorrect response when the device outputs a character which does not correspond to the original one; or the rejection of the character, when the device does not have sufficient elements for the decision. By carrying out functional tests in an OCR device it is possible to extract data about the discriminatory capacities of the device and organize them in a table, a so-called confusion table, which represents, for each input character, the number of times that character has been recognized in the form of a pre-determined output character.

Figure 6:
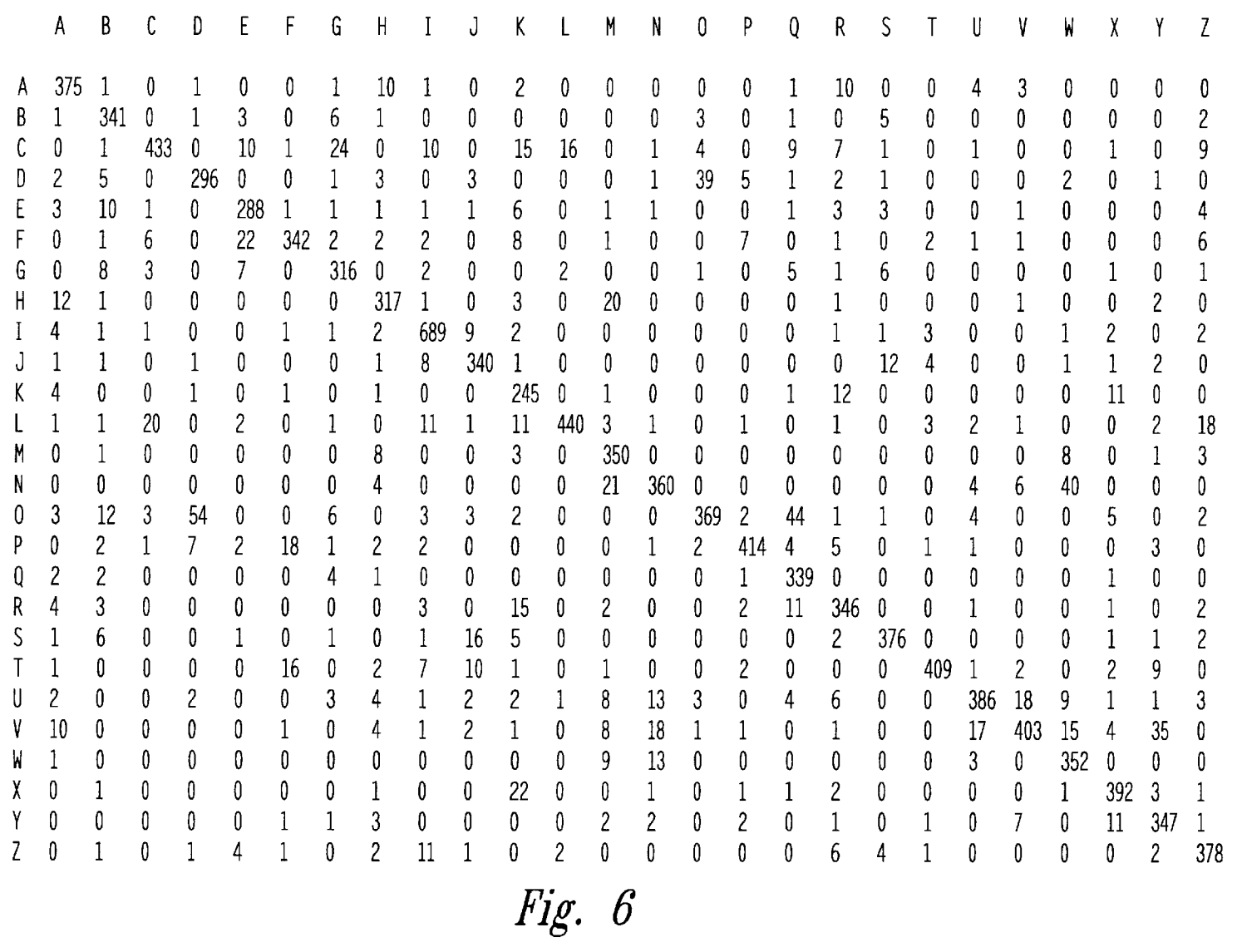

An example of a confusion table obtained for a given character recognition device is shown in FIG. 6. In the confusion table of FIG. 6, "rejections" of characters have not been accepted; the OCR device has been forced to supply an output character in any case. In this way, if on the one hand there is an increase in noise, on the other hand it is possible to show to a greater extent the morphological closenesses of the characters. In the table, relating to the recognition of upper-case characters, the number in correspondence with the intersection between a given column and a given row indicates the number of times the letter indicated in the column in question has been recognized as the letter indicated in that row. Consequently, the results relating to correct recognitions are plotted on the diagonal and the remaining results refer to incorrect recognitions. In practice, therefore, the confusion table represents the degree of similarity of one character to another.

An oriented and weighted graph has been extracted from the confusion table, from which graph the noise, produced by occasional incorrect character recognition, is excluded. This exclusion may be carried out by regarding as zero the similarity of characters which may have been confused with one another less frequently than a pre-determined threshold (less than 5 times for example). An adjacency graph is obtained in this way which, for the table of FIG. 6, assumes the form shown in FIG. 7. In practice, the adjacency graph graphically represents the proximity of groups of characters having homologous characteristics. The longer the path from one letter to another, the easier it is to recognize differences between them. The stronger connections may be identified by noting the weight of each connection and of the double connections existing between different pairs of characters.

Figures 7, 8:
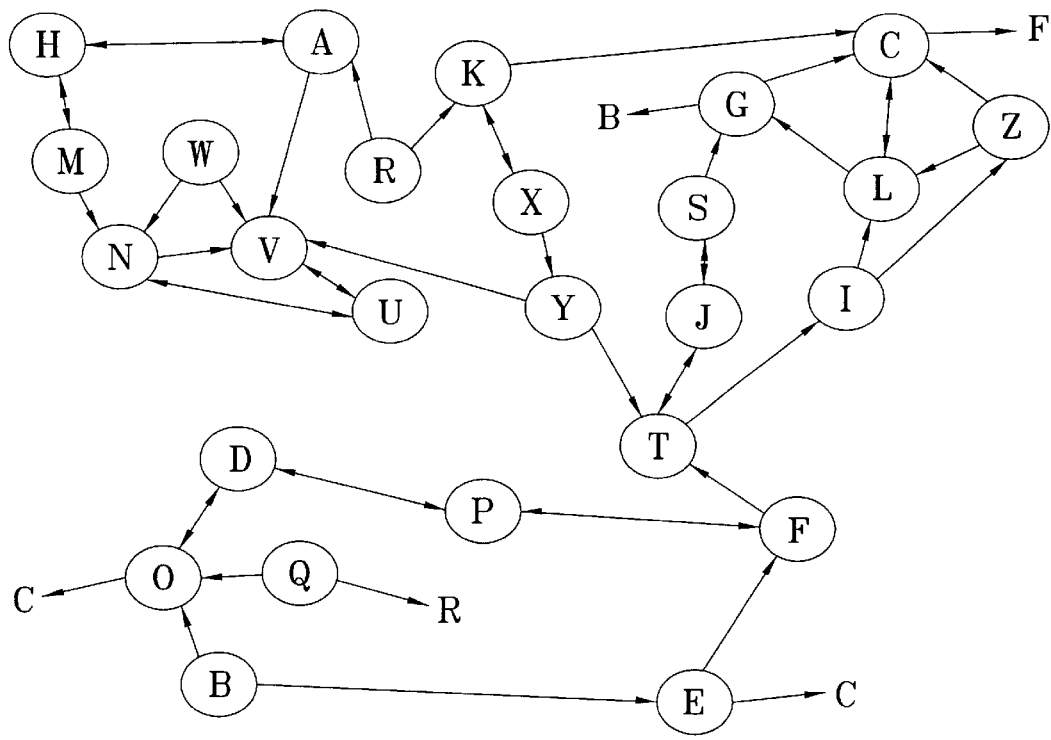
FIG. 7 shows a graph obtained from the table of FIG. 6.
FIG. 8 shows an adjacency list obtained from the graph of FIG. 7.

An adjacency list, shown in FIG. 8, in which the characters most easily confused with each other are placed one next to the other, has been obtained from the adjacency graph. This list is used to establish the coding of the characters in the memory array 10. In practice, the weight associated with each character is chosen such that the difference between two adjacent characters is represented solely by one weight unit, whilst very different weights correspond to distant elements. For example, the adjacency list of FIG. 8 may be coded by associating the weight (or coding) 0 for the letter D, 1 for the letter O, 2 for the letter Q and so on, up to 29 for the letter X.

In this way, and as mentioned above, the memory array 10 supplies, at each of its outputs 21, different values equal to the distance between the coding of the input word and the word stored in the row corresponding to that output. In particular, if the input word has a complete meaning and has been stored in the array 10, one of the outputs will have an output equal to 0, indicating that the input word has been recognized. When, on the other hand, none of the outputs has the value zero and one or more outputs has a very low voltage level, there is distorted recognition of a character due to the confusion of the original character with one of the characters adjacent to it on the adjacency list of FIG. 7.

Obviously, the coding obtained in this way is strictly linked to the performance of the OCR device which carries out the recognition and for different OCR devices it is necessary to repeat the procedure to obtain the respective adjacency list and hence the respective coding.

The advantages that can be obtained with the device described are as follows. The use of an associative memory enables the search for words most similar to an input word to be parallelized, enabling a high response rate to be obtained. The optimization of the memory occupation enables a large vocabulary to be stored and hence the recognition capacities of the device to be improved. The possibility of storing data of different types means that the device is highly flexible, on the basis of the requirements and the type of coding described which makes use of the homologies between the characters making the correct words more easily identifiable in the case in which the word to be recognized has one or more errors (characters reconstructed incorrectly). Consequently the device has improved efficiency and reliability compared with current devices.

Finally, it will be clear that numerous modifications and variants, all of which come within the scope of the inventive concept, may be introduced to the device described and illustrated here. In particular, the organization described of the memory array 10 and the coding illustrated are solely exemplary. The array may be of the auto-associative or hetero-associative type, whenever the data output are sufficient to identify one or more elements stored on the basis of the distance from the input word to be recognized. Although the device described permits an identification solely of words with a given type of characters (upper-case for example), the use of a larger number of devices or the use of a memory of larger size enables words with both types of character to be identified.

What is claimed is:

1. A word recognition device, comprising:
an associative memory storing weights, each weight associated with a respective character of the alphabet as a function of a similarity in shape among different ones of the characters, the memory having a plurality of memory lines each formed by a plurality of groups of memory locations, each group of memory locations in each of the memory lines being configured for storage of character weights corresponding to the characters of a respective word of a dictionary of words, with each group of memory locations configured to store character weights for words of a different maximum length than the adjacent group of memory locations in the memory line, the positional arrangement of the groups of memory locations in the memory line being the same for each memory line such that the correspondingly positioned groups of memory locations of the memory lines are configured to store character weights for words of the same maximum length; and
a switch matrix arranged to selectively enable one of the correspondingly positioned groups of memory locations of the memory lines configured to store character weights for words of the same maximum length.

2. The device of claim 1 wherein the value of the character weight associated with respective characters is closer in value to the character weights associated with characters having similar shapes than to the character weights associated with other characters having less similar shapes.

3. The device of claim 1 wherein the switch matrix is configured to receive an indication of the characters of a word to be recognized and generate character weights corresponding to the characters of the word to be recognized, and to supply the character weights of the word to be recognized to the associative memory, the associative memory being configured to compare the character weights of the word to be recognized supplied by the switch matrix with the character weights stored by the correspondingly positioned groups of memory locations of the memory lines enabled by the switch matrix.

4. The device of claim 1 further including a control providing the switch matrix with an indication of the one of the correspondingly positioned groups of memory locations of the memory lines to enable based on a length of a word to be recognized.

5. The device of claim 4 wherein the control further provides the switch matrix with an indication of the characters of the word to be recognized.

6. The device of claim 5 further including a reference voltage generator configured to supply to the switch matrix voltages corresponding to the character weights of the characters of the word to be recognized, and wherein the switch matrix supplies the voltages corresponding to the character weights of the word to be recognized to the associative memory, and the associative memory stores the character weights for words as voltages and compares the voltages corresponding to the character weights of the word to be recognized with the stored voltages corresponding to the character weights stored by the correspondingly positioned groups of memory locations of the memory lines enabled by the switch matrix.

7. The device of claim 5 further including a reference voltage generator configured to supply output voltages, each with a predetermined value corresponding to the character weight associated with one of the respective characters, and wherein the switch matrix is coupled to the reference voltage generator and configured to couple selected ones of the output voltages of the reference voltage generator to selected ones of a plurality of switch matrix outputs so as to supply at each of the selected switch matrix outputs a first voltage level having a predetermined value corresponding to the character weight of one character of the word to be recognized, and the groups of memory locations of the associative memory has words of the dictionary of words stored therein as a function of second voltage levels each having a predetermined value corresponding to the character weight associated with the respective characters of the stored words, the associative memory having a plurality of inputs coupled to the switch matrix outputs, the switch matrix selecting as the selected switch matrix outputs those that are coupled to the associative memory inputs which correspond to the groups of memory locations of the memory lines enabled by the switch matrix to supply the first voltage level at the selected switch matrix outputs to the ones of the associative memory inputs which correspond to the groups of memory locations of the memory lines enabled by the switch matrix, the associative memory being configured to output a correlation of the characters of the word to be recognized to the characters of the stored words as a function of a difference between the first and second voltages.

8. The device of claim 1 wherein the switch matrix is configured to enable one of the correspondingly positioned groups of memory locations of the memory lines based on a length of a word to be recognized, and further including a reference voltage generator configured to supply to the switch matrix voltages corresponding to the character weights of the characters of the word to be recognized, and wherein the switch matrix supplies the voltages corresponding to the character weights of the word to be recognized to the associative memory, and the associative memory stores the character weights for words as voltages and compares the voltages corresponding to the character weights of the word to be recognized with the stored voltages corresponding to the character weights stored by the correspondingly positioned groups of memory locations of the memory lines enabled by the switch matrix.

9. The device of claim 1 wherein the switch matrix is configured to enable one of the correspondingly positioned groups of memory locations of the memory lines based on a length of a word to be recognized, and further including a reference voltage generator configured to supply output voltages, each with a predetermined value corresponding to the character weight associated with one of the respective characters, and wherein the switch matrix is coupled to the reference voltage generator and configured to couple selected ones of the output voltages of the reference voltage generator to selected ones of a plurality of switch matrix outputs so as to supply at each of the selected switch matrix outputs a first voltage level having a predetermined value corresponding to the character weight of one character of the word to be recognized, and the groups of memory locations of the associative memory has words of the dictionary of words stored therein as a function of second voltage levels each having a predetermined value corresponding to the character weight associated with the respective characters of the stored words, the associative memory having a plurality of inputs coupled to the switch matrix outputs, the switch matrix selecting as the selected switch matrix outputs those that are coupled to the associative memory inputs which correspond to the groups of memory locations of the memory lines enabled by the switch matrix to supply the first voltage level at the selected switch matrix outputs to the ones of the associative memory inputs which correspond to the groups of memory locations of the memory lines enabled by the switch matrix, the associative memory being configured to output a correlation of the characters of the word to be recognized to the characters of the stored words as a function of a difference between the first and second voltages.

10. A word recognition device, comprising:
a memory storing weights, each weight associated with a respective character of the alphabet as a function of a similarity in shape among different ones of the characters, the memory having a plurality of memory lines each formed by a plurality of groups of memory locations, each group of memory locations in each of the memory lines being configured for storage of character weights corresponding to the characters of a respective word of a dictionary of words, with each group of memory locations configured to store character weights for words of a different maximum length than the adjacent group of memory locations in the memory line, the positional arrangement of the groups of memory locations in the memory line being the same for each memory line such that the correspondingly positioned groups of memory locations of the memory lines are configured to store character weights for words of the same maximum length; and means for selectively enabling one of the correspondingly positioned groups of memory locations of the memory lines configured to store character weights for words of the same maximum length.

11. The device of claim 10, wherein the enabling means is configured to receive an indication of the characters of a word to be recognized and generate character weights corresponding to the characters of the word to be recognized, and to supply the character weights of the word to be recognized to the memory, the memory being configured to compare the character weights of the word to be recognized supplied by the enabling means with the character weights stored by the correspondingly positioned groups of memory locations of the memory lines enabled by the enabling means.

12. The device of claim 11 further including a control providing the enabling means with an indication of the one of the correspondingly positioned groups of memory locations of the memory lines to enable based on a length of a word to be recognized.

13. The device of claim 10 further including a control providing the enabling means with an indication of the one of the correspondingly positioned groups of memory locations of the memory lines to enable based on a length of a word to be recognized and providing the enabling means with an indication of the characters of the word to be recognized, and a reference voltage generator configured to supply to the memory voltages corresponding to the character weights of the characters of the word to be recognized, and wherein the enabling means supplies the voltages corresponding to the character weights of the word to be recognized to the memory, and the memory stores the character weights for the words as voltages and compares the voltages corresponding to the character weights of the word to be recognized with the stored voltages corresponding to the character weights stored by the correspondingly positioned groups of memory locations of the memory lines enabled by the enabling means.

14. The device of claim 10 wherein the enabling means is configured to enable one of the correspondingly positioned groups of memory locations of the memory lines based on a length of a word to be recognized, and further including a reference voltage generator configured to supply to the enabling means voltages corresponding to the character weights of the characters of the word to be recognized, and wherein the enabling means supplies the voltages corresponding to the character weights of the characters of the word to be recognized to the memory, and the memory stores the character weights for words as voltages and compares the voltages corresponding to the character weights of the word to be recognized with the stored voltages corresponding to the character weights stored by the correspondingly positioned groups of memory locations of the memory lines enabled by the enabling means.

15. The device of claim 10 wherein the enabling means is configured to enable one of the correspondingly positioned groups of memory locations of the memory lines based on a length of a word to be recognized, and further including a reference voltage generator configured to supply output voltages, each with a predetermined value corresponding to the character weight associated with one of the respective characters, and wherein the enabling means is coupled to the reference voltage generator and configured to couple selected ones of the output voltages of the reference voltage generator to selected ones of a plurality of enabling means outputs so as to supply at each of the selected enabling means outputs a first voltage level having a predetermined value corresponding to the character weight of one character of the word to be recognized, and the groups of memory locations of the memory has words of the dictionary of words stored therein as a function of second voltage levels each having a predetermined value corresponding to the character weight associated with the respective characters of the stored words, the memory having a plurality of inputs coupled to the enabling means outputs, the enabling means selecting as the selected enabling means outputs those that are coupled to the memory inputs which correspond to the groups of memory locations of the memory lines enabled by the enabling means to supply the first voltage level at the selected enabling means outputs to the ones of the memory inputs which correspond to the groups of memory locations of the memory lines enabled by the enabling means, the memory being configured to output a correlation of the characters of the word to be recognized to the characters of the stored words as a function of a difference between the first and second voltages.

* * * * *